US010373878B2

(12) United States Patent
Jeon et al.

(10) Patent No.: US 10,373,878 B2
(45) Date of Patent: Aug. 6, 2019

(54) SEMICONDUCTOR DEVICE AND METHOD OF MANUFACTURING THE SAME

(71) Applicant: SAMSUNG ELECTRONICS CO., LTD., Suwon-si, Gyeonggi-Do (KR)

(72) Inventors: Kyung Yub Jeon, Yongin-si (KR); Soo Yeon Jeong, Osan-si (KR); Jae Kwang Choi, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/854,311

(22) Filed: Dec. 26, 2017

(65) Prior Publication Data

US 2018/0315662 A1 Nov. 1, 2018

Related U.S. Application Data

(60) Provisional application No. 62/490,314, filed on Apr. 26, 2017.

(51) Int. Cl.
*H01L 21/8234* (2006.01)
*H01L 29/66* (2006.01)

(52) U.S. Cl.
CPC ........ *H01L 21/823487* (2013.01); *H01L 21/823481* (2013.01); *H01L 29/66666* (2013.01); *H01L 21/823418* (2013.01); *H01L 21/823437* (2013.01)

(58) Field of Classification Search
None
See application file for complete search history.

(56) References Cited

U.S. PATENT DOCUMENTS

| | | | |
|---|---|---|---|
| 6,352,909 B1 | 3/2002 | Usenko | |
| 8,058,168 B2 | 11/2011 | Park et al. | |
| 8,058,683 B2 | 11/2011 | Yoon et al. | |
| 9,287,271 B2 | 3/2016 | Wang et al. | |
| 9,530,863 B1 | 12/2016 | Zhang et al. | |
| 9,536,793 B1 | 1/2017 | Zhang et al. | |
| 9,536,977 B2 | 1/2017 | Chuang et al. | |
| 2017/0069758 A1 | 3/2017 | Jan et al. | |
| 2018/0122800 A1* | 5/2018 | Cheng | H01L 27/088 |
| 2018/0233500 A1* | 8/2018 | Cheng | H01L 21/823878 |
| 2018/0294352 A1* | 10/2018 | Bi | H01L 29/7827 |

* cited by examiner

*Primary Examiner* — Asok K Sarkar
(74) *Attorney, Agent, or Firm* — F. Chau & Associates, LLC

(57) ABSTRACT

A method for manufacturing a semiconductor device is provided. A first vertical structure and a second vertical structure are formed on a substrate. The second vertical structure is positioned right next to the first vertical structure. The second vertical structure is positioned right next to the first vertical structure. An insulating layer is formed on the substrate between the first and second vertical structures. A gate metal and a gate dielectric layer are formed on the first and second vertical structures. A portion of the gate metal, gate dielectric layer, and insulating layer is removed. A portion of the substrate is removed. The portion of the substrate is removed after the gate metal is formed on the first and second vertical structure.

20 Claims, 11 Drawing Sheets

SEMICONDUCTOR DEVICE AND METHOD OF MANUFACTURING THE SAME

CROSS-REFERENCE TO RELATED APPLICATION

This application claims the benefit under 35 U.S.C. § 119 to U.S. Provisional Patent Application No. 62/490,314, filed on Apr. 26, 2017 in the U.S. Patent and Trademark Office, the disclosure of which is incorporated by reference herein in its entirety.

TECHNICAL FIELD

This invention relates generally to a semiconductor device with one or more trenches and a method of manufacturing the semiconductor device having one or more trenches.

DISCUSSION OF RELATED ART

In the manufacturing of a semiconductor device, a plurality of transistors may be electrically isolated by forming a trench from another plurality of transistors. In one example, the trench may be formed by forming a recess on the substrate, and filling an insulating material in the recess.

SUMMARY

According to an exemplary embodiment of the present inventive concept, a method for manufacturing a semiconductor device includes forming a first vertical structure and a second vertical structure on a substrate. The second vertical substrate is positioned right next to the first vertical structure. The method further includes forming a bottom source/drain region between the first and second vertical structures on the substrate. The method further includes forming an insulating layer on the substrate between the first and second vertical structures. The method still further includes forming a gate metal on the first and second vertical structures, and removing a portion of the gate metal and the insulating layer between the first and second vertical structures. The method further includes removing a portion of the substrate between the first and second vertical structures to form a trench. The removing the portion of the substrate occurs after the gate metal is formed on the first and second vertical structures.

According to an exemplary embodiment of the present inventive concept, a semiconductor device includes a first transistor extending from a substrate. The first transistor includes a first lower source/drain on the first lower source/drain region, a first vertical channel formed on the first lower source/drain region, and a first top source/drain region formed on the first vertical channel. The semiconductor device further includes a second transistor extending from the substrate. The second transistor includes a second lower source/drain region formed on the substrate, a second vertical channel formed on the second lower source/drain region, and a second top source/drain region formed on the second vertical channel. The semiconductor device also includes a first trench formed on the substrate between the first and second transistors. The first trench is filled with a first insulating material. A height of the first insulating material is greater than the height of an upper surface of the substrate.

According to an exemplary embodiment of the present inventive concept, a method for manufacturing a semiconductor device includes forming a plurality of bottom source/drain regions on a substrate, forming first, second, and third vertical structures on the substrate. Each vertical structure includes a vertical channel. The method further includes forming bottom spacers on the substrate between the first and second vertical structures, and the second and third vertical structures, respectively. The method still further includes forming a gate metal on surfaces of the first, second, and third vertical structures. The method further includes removing a portion of the gate metal from outer surfaces of the first, second, and third vertical surfaces, respectively, and forming first and second trenches on the substrate between the first and second vertical structures, and the second and third vertical structures, respectively. The forming the first and second trenches occurs after forming the gate metal.

According to an exemplary embodiment of the present inventive concept, a method for fabricating a chip includes forming a plurality of vertical structures on a substrate. Each of the plurality of vertical structures includes a top source/drain region and a channel. The method further includes forming a plurality of bottom source/drain regions on the substrate between the plurality of vertical structures. The method still includes forming a spacer on the plurality of bottom source/drain regions between the plurality of vertical structures, forming a gate metal on the spacer and on the plurality of vertical structures. The method further includes removing a portion of the gate metal and a portion of the substrate between the plurality of vertical structures to form one or more trenches and corresponding spaces above the one or more trenches. The method further includes filling the one or more trenches and the corresponding spaces by an oxide or nitride in one filling step. The method still further includes manufacturing a plurality of transistors with trenches formed between the plurality of transistors.

BRIEF DESCRIPTION OF THE DRAWINGS

The above and other features of the present inventive concept will be more apparent by describing in detail exemplary embodiments thereof, with reference to the accompanying drawings, which.

DETAILED DESCRIPTION OF EMBODIMENTS

Exemplary embodiments of the present inventive concept will be described more fully hereafter with reference to the accompanying drawing. The present disclosure may, however, be embodied in many different forms and should not be construed as limited to the embodiments set forth herein.

It will be understood that when an element such as a layer, film, region, or substrate is referred to as being "on" another element, it can be directly on the other element or intervening elements may also be present. It will be also understood that when an element such as a layer, film, region, or substrate is referred to as being "under" another element, it can be directly under the other element or intervening elements may also be present.

Figure 1:
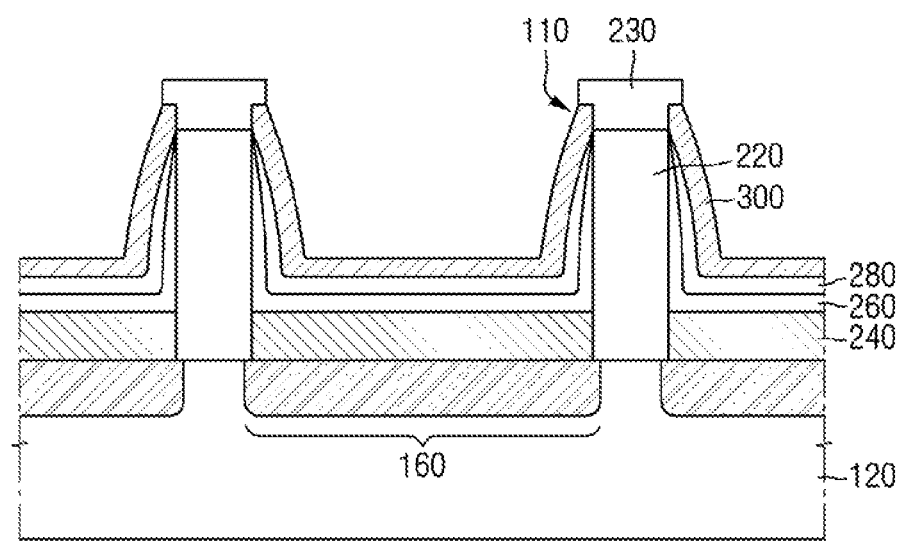
FIG. 1 is a cross-sectional view of a semiconductor device according to an exemplary embodiment of the present inventive concept.

Referring to FIG. 1, a cross-sectional view of a semiconductor device 100 may be illustrated according to an exemplary embodiment of the present inventive concept. In one embodiment, the semiconductor device 100 may include one or more vertical channel field effect transistors (FET) 110. In one example, the FET 110 may include an n-type FET. In another example, the FET 110 may include a p-type FET. The invention, however, is not limited thereto. The semiconductor device 100 may include both the n-type FET and the p-type FET.

The semiconductor device 100 may include a substrate 120. The substrate 120 may include, for example, silicon (Si), germanium (Ge), silicon-germanium (SiGe), III-V compound semiconductor or the like. The semiconductor device 100 may include a bottom source/drain region 160. The bottom source/drain region 160 may include a semiconductor material. For example, the bottom source/drain region 160 may include Si, Ge, or SiGe.

In one embodiment, the bottom source/drain region 160 may include an epitaxial layer. In one embodiment, the bottom source/drain region 160 may be formed by doping, for example, Si, Ge, or SiGe with the n-type impurity or the p-type impurity to selectively form the n-doped semiconductor layer or p-doped semiconductor layer. The n-type impurity or p-type impurity may be doped into the substrate 120 by, for example, an ion implantation. The p-type impurity may include, for example, boron (B) or aluminum (Al), and the n-type impurity may include, for example, phosphorous (P) or arsenic (As). The composition of the substrate 120, ion energy, or heat treatment condition may determine the depth and a width of the bottom source/drain region 160. In one example, the width of the bottom source/drain region 160 may be substantially the same as a gap between neighboring vertical channels 220. The invention, however, is not limited thereto. In another example, the width of the bottom source/drain region 160 may be greater than the gap between neighboring vertical channels 220.

A vertical channel 220 may be formed on the bottom source/drain region 160. The vertical channel 220 may include, for example, an undoped semiconductor. For example, the vertical channel 220 may include Si, Ge, SiGe or III-V compound semiconductors. As shown, the vertical channel 220 may be disposed at least on a portion of the bottom source/drain region 160, and the vertical channel 220 may be disposed to be in electrical contact with the bottom source/drain region 160.

The semiconductor device 100 may further include the top source/drain region 230 formed on an upper surface of the vertical channel 220. The top source/drain region 230 may include Si, Ge, SiGe or III-V compound semiconductors. In one embodiment, the top source/drain region 230 may be formed by doping silicon (Si) with the n-type impurity or the p-type impurity to form the n-doped semiconductor layer or p-doped semiconductor layer.

While not illustrated in FIG. 1, the top source/drain region 230 may be connected to one or more metal contacts for supplying electrical signals to the top source/drain region 230. The one or more metal contacts may include, for example, tungsten (W), cobalt (Co), copper (Cu), tantalum (Ta), titanium (Ti), ruthenium (Ru), aluminum (Al), metal carbides, or metal nitrides.

A bottom spacer 240 may be formed on the substrate 120. For example, as shown in FIG. 1, the bottom spacer 240 may be formed on the bottom source/drain region 160. The bottom spacer 240 may isolate the bottom source/drain region 160 from other structural elements formed on the bottom spacer 240, and may include an insulating layer. In one example, the bottom spacer 240 may include silicon nitride ($Si_3N_4$) or silicon oxide ($SiO_2$).

A gate dielectric layer 260 with a predetermined thickness may be formed on the outer surface of the vertical channel 220. In one example, the gate dielectric layer 260 may be formed to conformally cover the outer surface of the vertical channel 220. In another example, the gate dielectric layer 260 may be formed on the bottom spacer 240. The gate dielectric layer 260 may include, for example, silicon oxide ($SiO_2$), silicon nitride ($Si_3N_4$), silicon oxynitride (SiON), zirconium oxide ($ZrO_2$), zirconium oxynitride (ZrON), hafnium zirconium oxide (HfZrO), aluminum oxide ($Al_2O_3$), tantalum pentoxide ($Ta_2O_5$), or compounds thereof. In another example, the gate dielectric layer 260 may include high K dielectric material, for example, barium titanate ($BaTiO_3$), barium strontium titanate (BST), titanium oxide ($TiO_2$), or compounds thereof.

A gate metal 280 may be formed on the gate dielectric layer 260. In one embodiment, the height of an upper portion of the gate metal 280 may be substantially the same as the height of the upper portion of the vertical channel 220. The present invention, however, is not limited thereto. In another embodiment, the gate metal 280 may be formed only on a portion of the vertical channel 220. The gate metal 280 may include, for example, tungsten (W), cobalt (Co), copper (Cu), tantalum (Ta), titanium (Ti), ruthenium (Ru), aluminum (Al), metal carbides, or metal nitrides.

A top spacer 300 may be formed on the gate metal 280 and around a portion of the sidewall of the top source/drain region 230 to isolate the gate metal 280 from the top source/drain region 230. The top spacer 300 may include, for example, silicon nitride ($Si_3N_4$) or silicon oxide ($SiO_2$).

Figure 2:
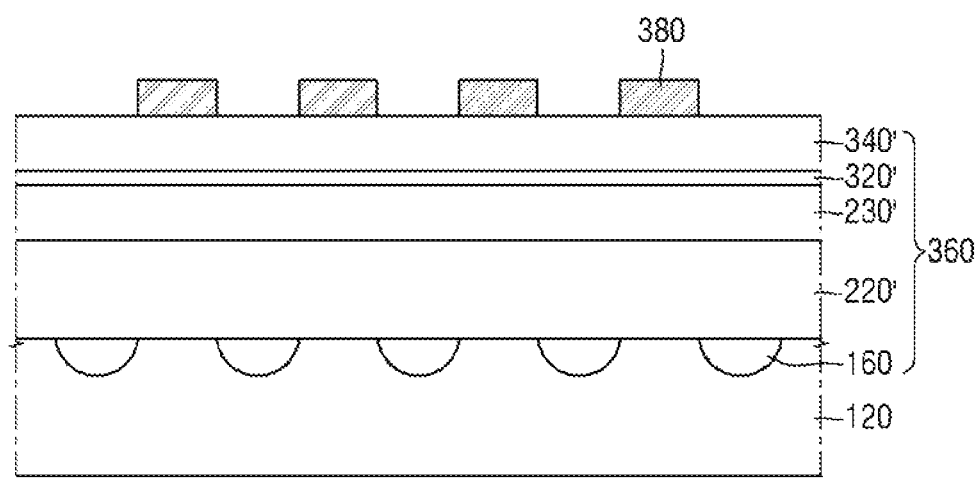
FIG. 2 is a cross-sectional view illustrating formation of a plurality of layers and photoresist patterns on the substrate during manufacture of a semiconductor device according to an exemplary embodiment of the present inventive concept.

FIG. 2 is a cross-sectional view illustrating formation of a plurality of layers and one or more photoresist patterns 380 on the plurality of layers during the manufacture of the semiconductor device 100 according to an exemplary embodiment of the present inventive concept. In one embodiment, the plurality of layers may form a stack 360. For example, the bottom source/drain region 160 may be formed on the substrate 120 prior to forming the plurality of layers by, for example, chemical vapor deposition (CVD). In one embodiment, the ion implantation process may be used to provide the n-type or p-type impurities to form the n-type or p-type region in the bottom source/drain region 160. In one embodiment, during or after the ion implantation, the substrate 120 may be annealed at a predetermined temperature, and the n-type or p-type impurities may be diffused through the substrate 120.

The vertical channel layer 220', and the top source/drain region layer 230' may be sequentially formed on the substrate 120. At least one of the vertical channel layer 220' or the top source/drain region layer 230' may be formed by, for example, CVD, and may include an epitaxial layer. An oxide layer 320' and a nitride layer 340' may be sequentially formed using, for example, CVD on the top source/drain region layer 230. The photoresist patterns 380 may be formed using a photolithography process on the nitride layer 340' to use the photoresist patterns 380 as a mask to selectively etch the stack 360 in the later stage.

The invention, however, is not limited to thereto. In one embodiment, the vertical channel layer 220' and the top source/drain region layer 230' may by formed by etching down the substrate 120 by a predetermined depth. For example, the substrate 120 may be provided with the n-type or p-type dopants by, for example, the ion implantation, to form the vertical channel layer 220', the top source/drain region layer 230' having different electrical properties. In one example, a p-type or n-type layer with a predetermined thickness may be formed by selectively irradiating the p-type or n-type impurities in the substrate 120.

Figure 3:
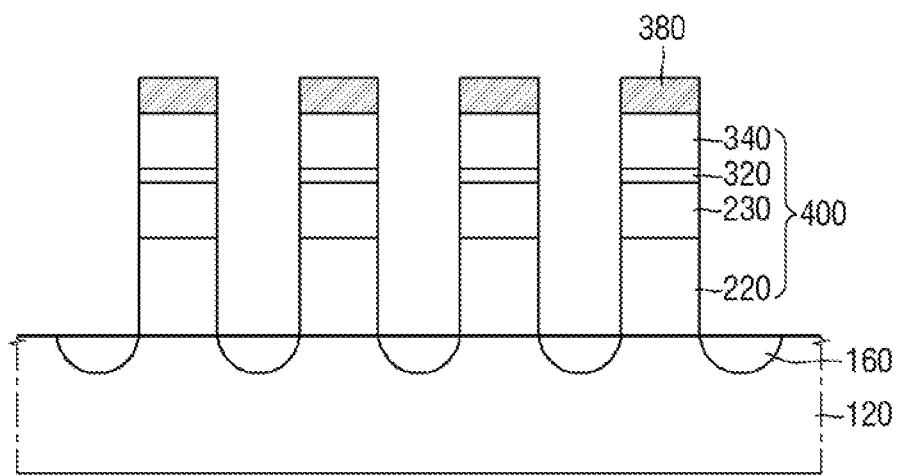
FIG. 3 is a cross-sectional view illustrating formation of a vertical stack during manufacture of a semiconductor device according to an exemplary embodiment of the present inventive concept.

Referring to FIG. 3, a portion of the stack 360 may be selectively etched to form one or more vertical structures 400 according to an exemplary embodiment of the present inventive concept. In one embodiment, the stack 360 may be patterned using the one or more photoresist patterns 380 as the mask by dry etching or wet etching. After the vertical structures 400 are formed, the photoresist patterns 380 may be removed to expose the nitride layer 340.

Figure 4:
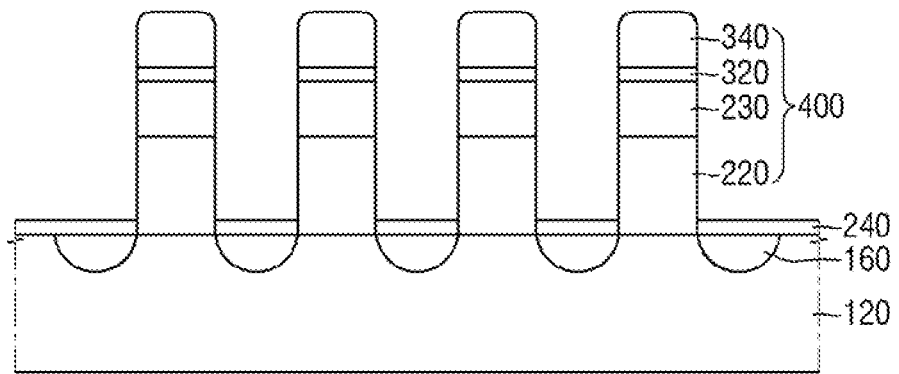
FIG. 4 is a cross-sectional view illustrating formation of a bottom spacer during manufacture of a semiconductor device according to an exemplary embodiment of the present inventive concept.

Referring to FIG. 4, the bottom spacer 240 may be formed on the bottom source/drain region 160 according to an exemplary embodiment of the present inventive concept. In one embodiment, a bottom spacer layer may be conformally formed on the outer surface of the vertical structures 400 and on the substrate 120. A portion of the bottom spacer layer may be selectively removed to form the bottom spacer 240 on the bottom source/drain region 160. As shown, the bottom spacer 240 may separate the bottom source/drain region 160 from other layers formed above the bottom spacer 240. The bottom spacer 240 may be formed by depositing, for example, the silicon nitride or silicon oxide using, for example, CVD.

Figure 5:
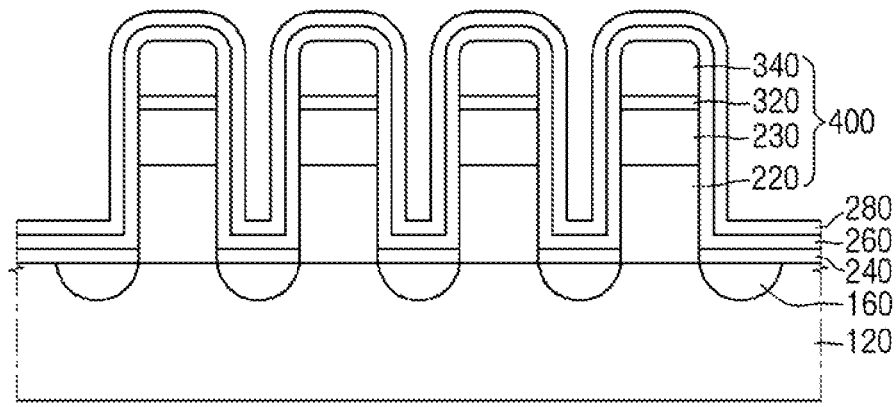
FIG. 5 is a cross-sectional view illustrating formation of a gate dielectric and a gate metal during manufacture of a semiconductor device according to an exemplary embodiment of the present inventive concept.

FIG. 5 illustrates formation of the gate dielectric layer 260 and the gate metal 280 on vertical structures 400 according to an exemplary embodiment of the present inventive concept. In one embodiment, the gate dielectric layer 260 may be formed on the outer surface of the vertical structure 400 by CVD, atomic layer deposition (ALD), physical vapor deposition (PVD), or thermal oxidation, or combination thereof. The gate dielectric layer 260 may include, for example, silicon oxide ($SiO_2$), silicon nitride ($Si_3N_4$), silicon oxynitride (SiON), zirconium oxide ($ZrO_2$), zirconium oxynitride (ZrON), hafnium zirconium oxide ($HfZrO_2$), aluminum oxide ($Al_2O_3$), tantalum pentoxide ($Ta_2O_5$), or compounds thereof. In another example, the gate dielectric layer 260 may include high K dielectric materials, for example, barium titanate ($BaTiO_3$), barium strontium titanate (BST), titanium oxide ($TiO_2$), or compounds thereof. The gate metal 280 may be deposited on the gate dielectric layer 260 using, for example, CVD, ALD, or PVD. The gate metal 280 may be made of, for example, tungsten (W), cobalt (Co), copper (Cu), tantalum (Ta), titanium (Ti), ruthenium (Ru), aluminum (Al), metal carbides, or metal nitrides, for example, titanium nitride (TiN).

Figure 6:
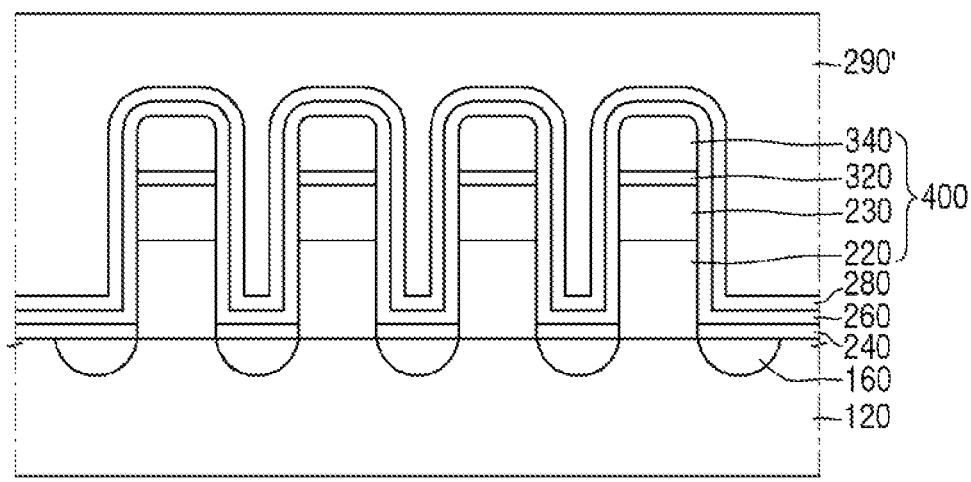
FIG. 6 is a cross-sectional view illustrating formation of an organic planarization layer (OPL) during manufacture of a semiconductor device according to an exemplary embodiment of the present inventive concept.
Figure 7:
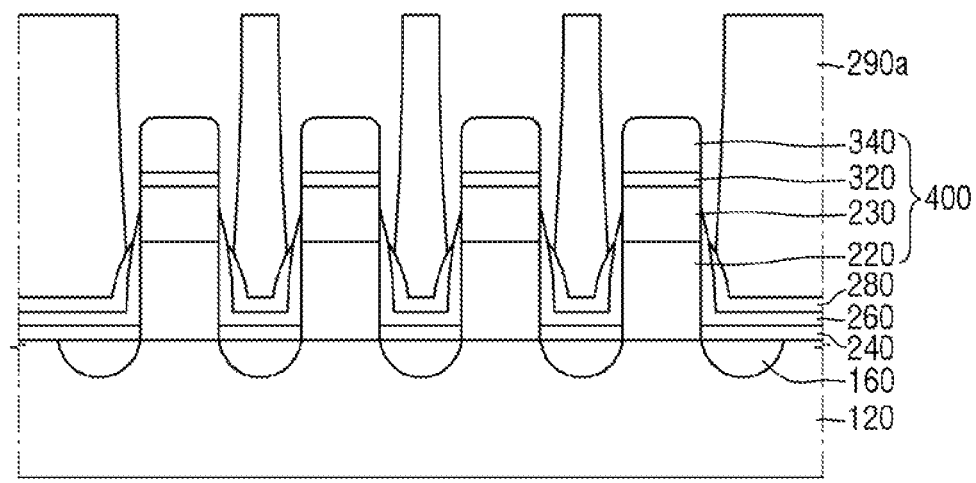
FIG. 7 is a cross-sectional view illustrating a photolithography process for forming patterned OPL during manufacture of a semiconductor device according to an exemplary embodiment of the present inventive concept.
Figure 8:
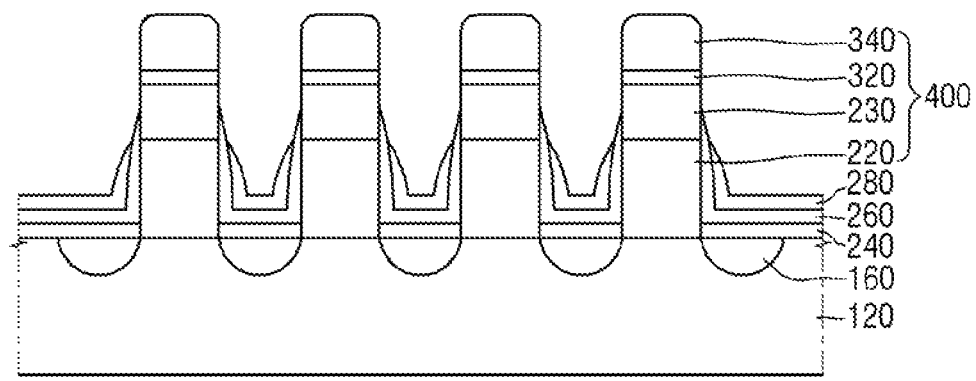
FIG. 8 is a cross-sectional view illustrating etching of the gate dielectric and the gate metal during manufacture of a semiconductor device according to an exemplary embodiment of the present inventive concept.

Referring to FIGS. 6 through 8, the gate dielectric layer 260 and the gate metal 280 may be selectively removed according to an exemplary embodiment of the present inventive concept. In one example, an organic planarization layer (OPL) 290' may be formed on the gate metal 280 for planarization as shown in FIG. 6. The invention, however, is not limited thereto. For example, spin-on-hardmask (SOH), an amorphous carbon layer (ACL), or other photoresist layers may be formed on the gate metal 280. Referring to FIG. 7, the OPL 290' may be selectively patterned to remove a portion of the gate metal 280 and the gate dielectric layer 260. In one embodiment, the upper portion of the gate metal 280 and/or gate dielectric layer 260 may be removed by, for example, dry etching or wet etching process, using the OPL patterns 290a as the mask as shown in FIG. 7.

As a result, the upper portion of the nitride layer 340 may be exposed, and the gate dielectric layer 260 and the gate metal 280 may be formed on the sidewalls of the vertical channel 220. In another example, the gate dielectric layer 260 may be formed on the top source/drain region 230. After the upper portion of the gate dielectric layer 260 and gate metal 280 are removed, remaining OPL patterns 290a may be removed by, for example, ashing process to expose a lower portion of the gate metal 280 and/or gate dielectric layer 260 as shown in FIG. 8.

Figure 9:
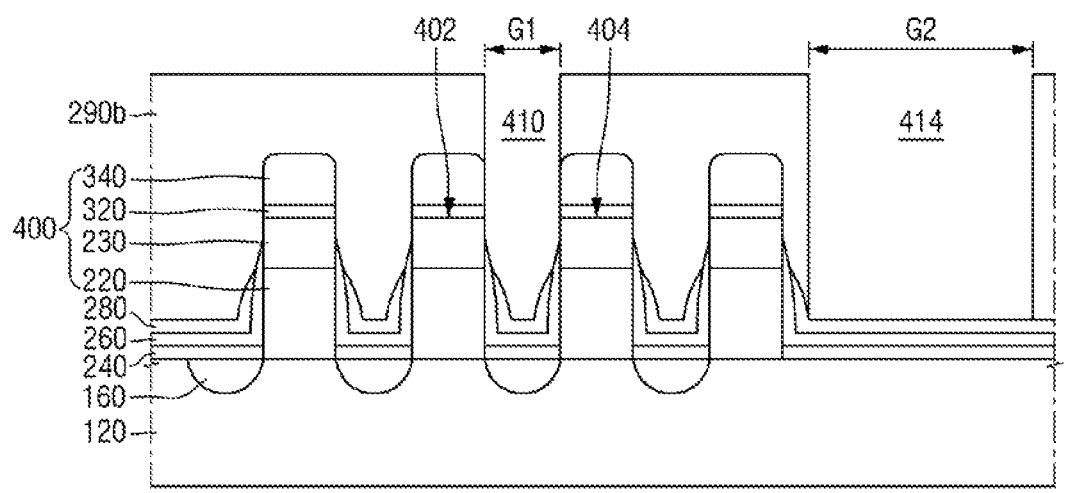
FIG. 9 is a cross-sectional view illustrating the photolithography process for forming patterned OPL during manufacture of a semiconductor device according to an exemplary embodiment of the present inventive concept.
Figure 10:
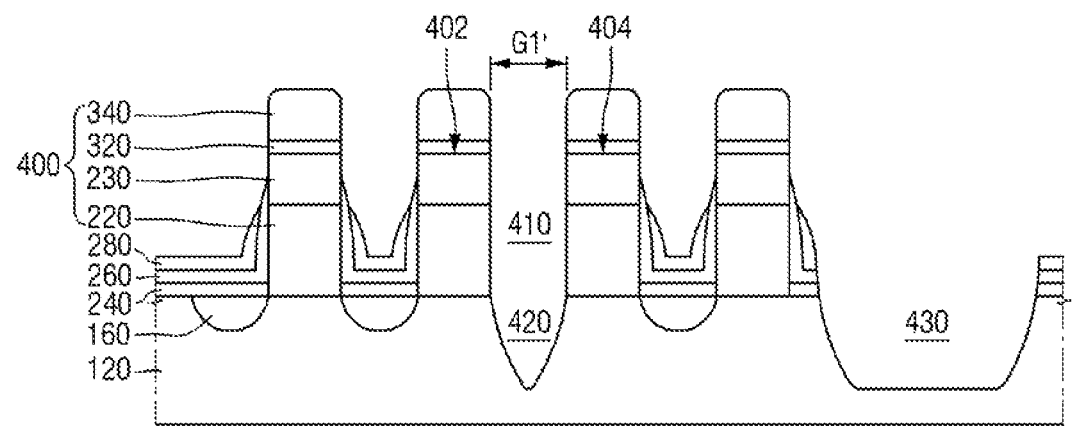
FIG. 10 is a cross-sectional view illustrating forming a trench on the substrate during manufacture of a semiconductor device according to an exemplary embodiment of the present inventive concept.
Figure 11:
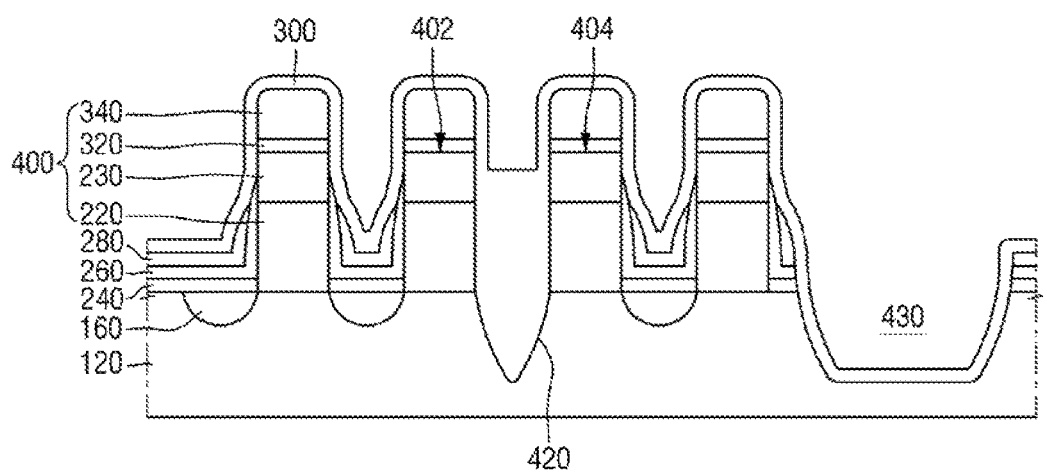
FIG. 11 is a cross-sectional view illustrating filling the trench during manufacture of a semiconductor device according to an exemplary embodiment of the present inventive concept.

Referring to FIGS. 9-11, one or more trenches may be formed on the substrate 120 according to an exemplary embodiment of the present inventive concept. Referring to FIG. 9, the OPL patterns 290b may be formed by the photolithography process according to an exemplary embodiment of the present inventive concept. For example, the OPL layer may be formed on the vertical structures 400. Subsequently, a photoresist layer (not shown) may be formed and patterned on the OPL layer to form the OPL patterns 290b with the gap G1 in the OPL patterns 290b. The OPL patterns 290 may be used as the mask to remove the gate metal 280, gate dielectric layer 260, and bottom spacer 240 between the neighboring vertical structures 402, 404. In one embodiment, the gap G1 in the OPL patterns 290b may be substantially the same as the gap G1' between the neighboring vertical structures 402, 404. In another embodiment, the gap G1 may be different from the gap G1' between the neighboring vertical structures 402, 404. For example, the gap G1 may be smaller or greater than the gap G1' between the neighboring vertical structures 402, 404.

The OPL patterns 290b may be positioned with respect to the vertical structures, for example, the neighboring vertical structures 402, 404 to align the gap G1 in the OPL patterns 290b with the gap G1' between the neighboring vertical structures 402, 404. Subsequently, the dry etching may be performed by providing reactive species from the above the OPL patterns 290b. The reactive species may enter a space 410 from above the OPL patterns 290b in a downward direction to remove the gate metal 280, gate dielectric layer 260, or bottom spacer 240 between the adjacent vertical structures 402, 404. In one embodiment, the space 410 may be a space above an upper surface of the substrate 120 between two neighboring vertical structures 402, 404. When the gate metal 280, gate dielectric layer 260, or bottom spacer 240 are removed in the space 410, the dry etching may further proceed in a downward direction to remove a portion of the substrate to form a first trench 420 until a predetermined depth of the first trench 420 is reached. The gate metal 280 and the substrate 120 may be removed in one processing step. As a result, the first trench 420 may physically and electrically isolate the vertical structure 402 from the vertical structure 404. The first trench 420 may have a wedge shape.

The OPL patterns 290b may include a pattern with the gap G2 as shown in FIG. 9. The height of the pattern with the gap G2 may be greater than the height of the vertical structures to form a space 414. In one embodiment, one or more reactive species may be provided to the space 414 in the downward direction to remove the gate metal 280, gate dielectric layer 260, and bottom spacer 240 formed on the upper surface of the substrate 120, where the vertical structures are not formed. The dry etching, for example, may proceed to remove a portion of the substrate 120 to form the second trench 430. As a result, the second trench 430 may physically and electrically isolate one or more vertical structures from one or more vertical structures separated by the second trench 430. In one example, the second trench 430 may be in the shape of an inverted trapezoid. In one embodiment, the first trench 420 and the second trench 430 may be formed substantially at the same time during one etching step, and the depth of the second trench 430 may be substantially the same as the depth of the first trench 420.

FIG. 11 illustrates filling the first trench 420 on the substrate 120 according to an exemplary embodiment of the present inventive concept. In one example, the top spacer 300 may be formed in the first trench 420 and the space 410 by, for example, CVD or ALD, using, for example, one of the oxide or nitride to further isolate the two immediately neighboring vertical structures 402, 404. In one embodiment, the top spacer 300 may be conformally formed on the outer surface of the vertical structures, and may fill the first trench 420 between two neighboring vertical structures 402, 404. In one embodiment, the top spacer 300 may fill the space 410 after the first trench 420 is filled between two neighboring vertical structures 402, 404. For example, the top spacer 300 may fill the first trench 420 and space 410 between the neighboring vertical structures 402, 404, and the height of the upper surface of the top spacer 300 between the neighboring vertical structures 402, 404 may be greater than the upper surface of the substrate 120. For example, the height of the upper surface of the top spacer 300 may be substantially the same as or greater than the height of the top source/drain region 230 of the vertical structures 402, 404 as shown in FIG. 11. The invention, however, is not limited thereto. For example, the height of the top spacer 300 in the space 410 may be less than the height of the top source/drain region 230 of the vertical structures 400.

In one embodiment, the top spacer 300 formed on the second trench 430 may not be as thick as the top spacer 300 formed in the space 410 and the first trench 420. As shown in FIG. 11, the top spacer 300 may be conformally formed on the upper surface of the second trench 430, and the thickness of the second trench 430 may not be greater than the thickness of the top spacer 300 formed in the space 410 and the first trench 420 between the neighboring vertical structures 402, 404.

Figure 12:
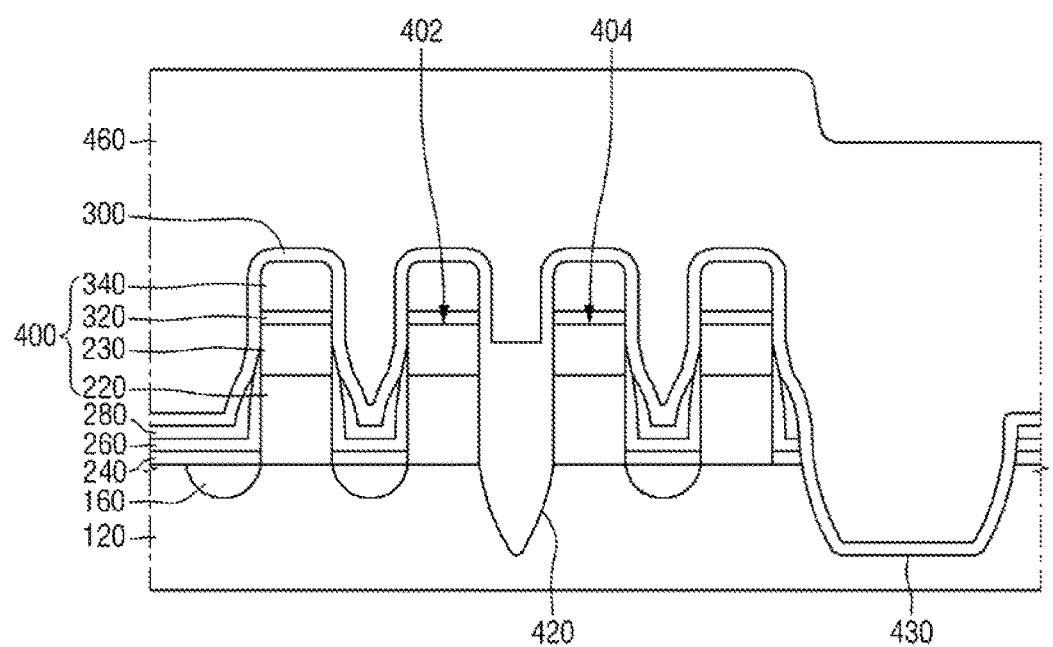
FIG. 12 is a cross-sectional view illustrating formation of an insulating layer on a top spacer during manufacture of a semiconductor device according to an exemplary embodiment of the present inventive concept.

Referring FIG. 12, an insulating layer 460 may be formed on the top spacer 300 according to an exemplary embodiment of the present inventive concept. The insulating layer 460 may include, for example, silicon oxide, and may be formed using, for example, CVD. An upper surface of the insulating layer 460 may not include substantially flat surface. For example, the insulating layer 460 may include one or more steps when the insulating layer 460 is formed on the, for example, vertical structures 402, 404 and the second trench 430 due to the difference of the height between the vertical structures 402, 404 and the second trench 430. In one embodiment, the height of the lowest upper surface of the insulating layer 460 may be higher than the height of the vertical structure 400 as shown in FIG. 12. In one embodiment, the second trench 430 may be filled by the insulating layer 460. For example, the top spacer 300 may be formed on the surface of the second trench 430, and the insulating layer 460 may be formed on the top spacer 300 to form a layered structure. The upper surface of the insulating layer 460 may be higher than the upper surface of the substrate 120.

Figure 13:
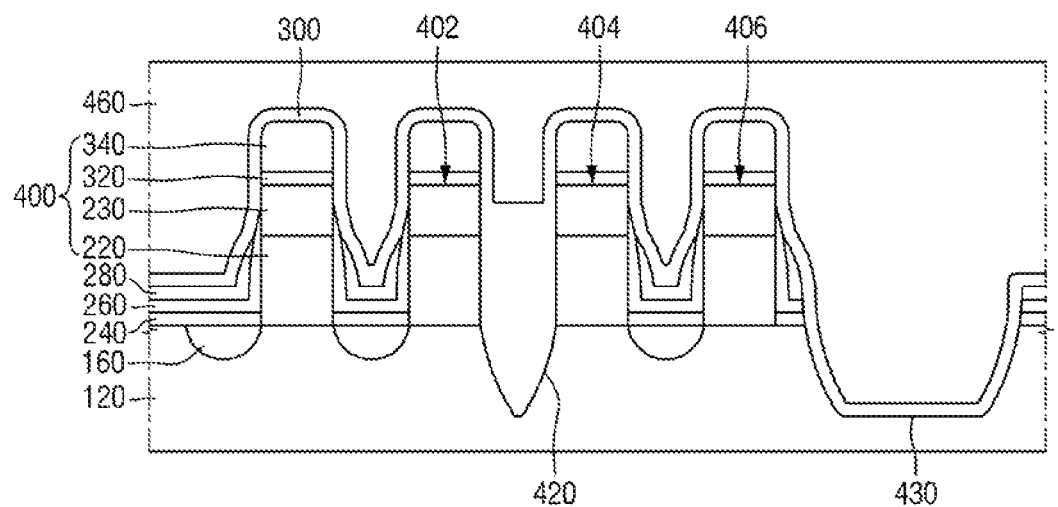
FIG. 13 is a cross-sectional view illustrating formation of the insulating layer on the top spacer during manufacture of a semiconductor device according to an another exemplary embodiment of the present inventive concept.

Referring to FIG. 13, the second trench 430 may be formed adjacent to vertical structure 406, and the second trench 430 may be filled by the top spacer 300 and the insulating layer 460 formed on the top spacer 300 to form the stacked structure.

Figure 14:
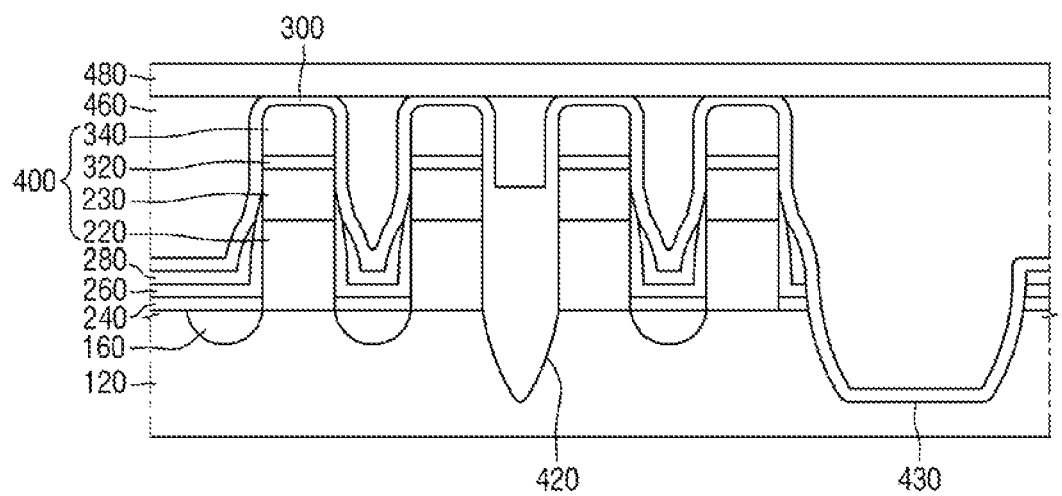
FIG. 14 is a cross-sectional view illustrating a chemical mechanical polishing (CMP) process for the insulating layer and formation of a stopper layer during manufacture of a semiconductor device according to an exemplary embodiment of the present inventive concept.

Referring to FIG. 14, a chemical mechanical planarization (CMP) may be performed for flattening and/or smoothing the insulating layer 460 according to an exemplary embodiment of the present inventive concept. In one embodiment, the CMP process may be performed until the top spacer 300 may be reached. After the CMP process is complete, a stopper 480 may be formed on the insulating layer 460 using, for example, CVD or ALD. The stopper 480 may include, for example, nitride or oxide. The stopper 480 may protect the underlying vertical structures 400 from being damaged by the subsequent etching processes. The top spacer 300 formed in the first trench 420 may have different shape. For example, as shown in FIG. 14, a top portion of the top spacer 300 in the first trench 420 may be unevenly formed. In another example, depending on the deposition thickness and/or the geometry of the first trench 420, a top portion of the top spacer 300 may be substantially filled in the first trench 420, and may be formed to be flat.

Figure 15:
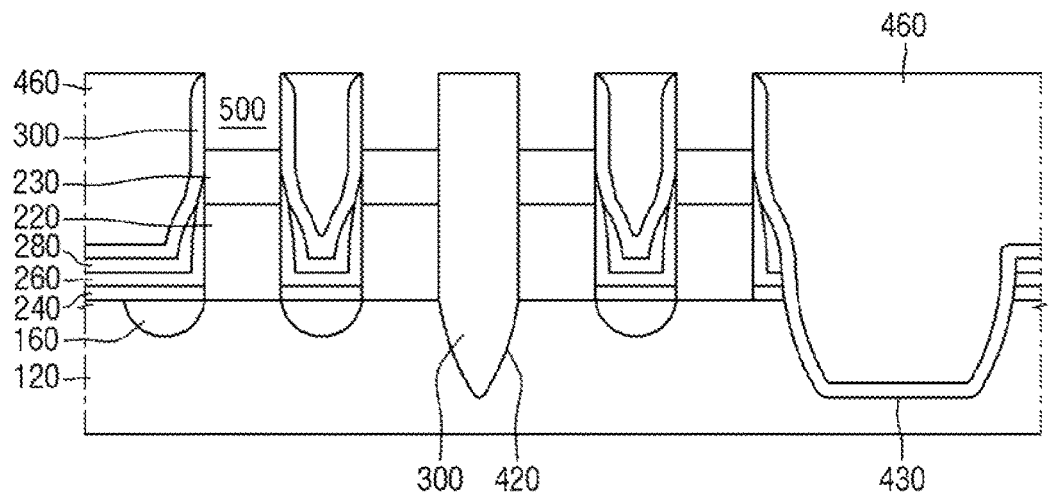
FIG. 15 is a cross-sectional view illustrating formation of patterned insulating layer during manufacture of a semiconductor device according to an exemplary embodiment of the present inventive concept.
Figure 16:
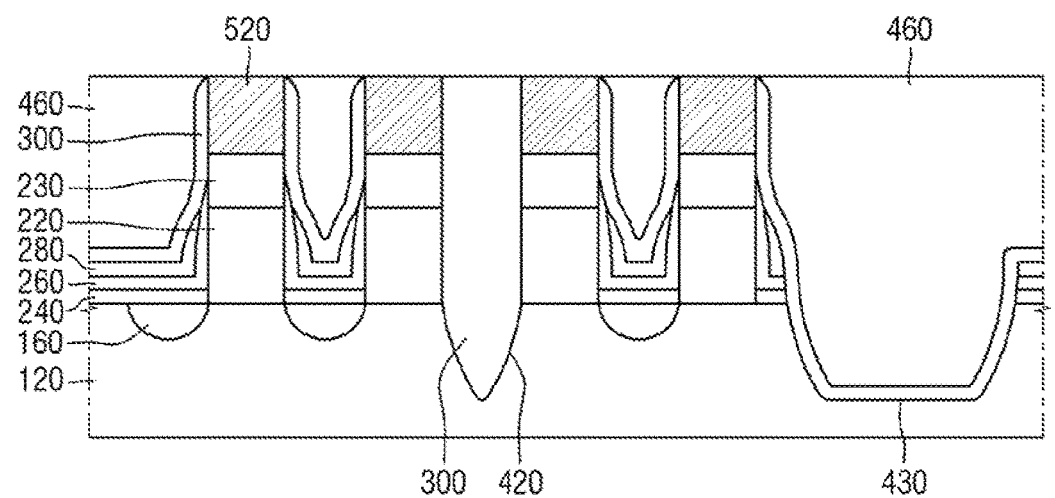
FIG. 16 is a cross-sectional view illustrating formation of metal contacts during manufacture of a semiconductor device according to an exemplary embodiment of the present inventive concept.

Referring to FIGS. 15 and 16, the nitride layer 340 and the oxide layer 320 may be removed to form a metal contact 520 according to one or more exemplary embodiment of the present inventive concept. FIG. 15 illustrates that, for example, the stopper 480 may be selectively removed by, for example, reactive ion etching (RIE). In one embodiment, the RIE may remove the nitride layer 340 and the oxide layer 320 for providing a space 500 for forming a metal contact. In one example, the RIE may not significantly remove the insulating layer 460 due to the selectivity. FIG. 16 illustrates that the metal contacts 520 may be filled in the space 500 for electrically connecting the top source/drain region 230 with one or more circuits outside the semiconductor device 100. The metal contact may include, for example, tungsten (W), cobalt (Co), copper (Cu), tantalum (Ta), titanium (Ti), ruthenium (Ru), aluminum (Al), metal carbides, or metal nitrides.

Figure 17:
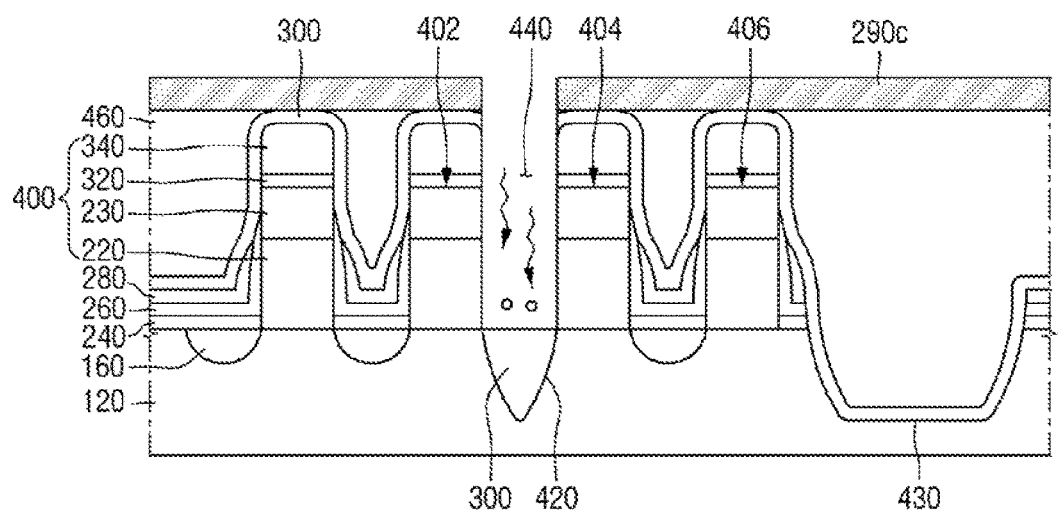
FIGS. 17-19 are cross-sectional views illustrating re-connecting the gate metal after the trench is formed during manufacture of a semiconductor device according to an exemplary embodiment of the present inventive concept.
Figure 18:
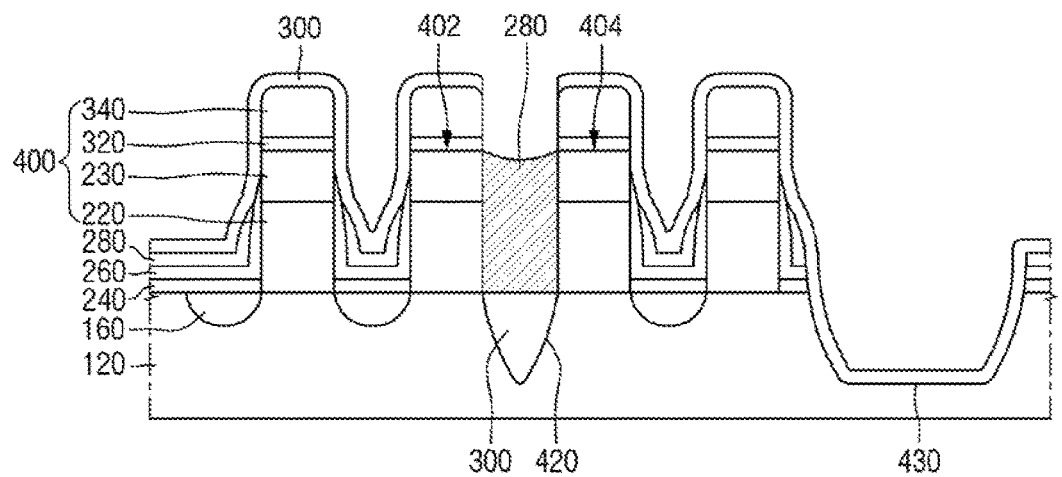
Figure 19:
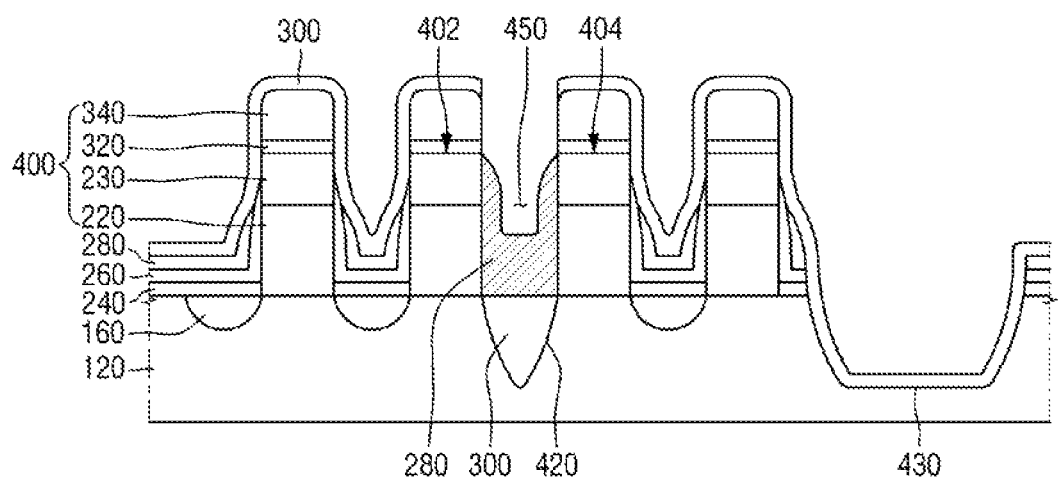

FIGS. 17 through 19 illustrate a method of re-connecting the gate metal 280 after a space 440 is formed according to an exemplary embodiment of the present inventive concept. In one embodiment, the gate metal 280 may be re-connected after the space 440 is formed and the top spacer 300 is filled in the space 440. For re-connecting the gate metal 280, in one embodiment, the OPL or other patterned mask with one or more openings may be formed on the vertical structures 400. In one embodiment, the top spacer 300, gate metal 280, gate dielectric layer 260, or bottom spacer 240 may be removed between the neighboring vertical structures 402, 404 by, for example, dry etching using the OPL patterns 290c as the mask. In one embodiment, the dry etching may be performed until the upper surface of the substrate 120 is reached. In another embodiment, the wet etching may be performed in removing the top spacer 300, gate metal 280, gate dielectric layer 260, or bottom spacer 240 between the neighboring vertical structures 402, 404.

Subsequently, gate metal 280 may be formed by, for example, CVD in the space 440. In one embodiment, as shown in FIG. 18, the gate metal 280 may be filled below the top source/drain region 230. The invention, however, is not limited thereto. In another embodiment, the gate metal 280 may be filled above the top source/drain region 230. A portion of the gate metal 280 may be removed by wet etching or dry etching. For example, as shown in FIG. 19, the gate metal 280 may be partially etched to form a space 450 between two adjacent vertical structures 402, 404, and may connect two neighboring vertical structures 402, 404. In this case, the first trench 420 may be filled with the top spacer 300 to isolate the neighboring vertical structures 402, 404.

Figure 20:
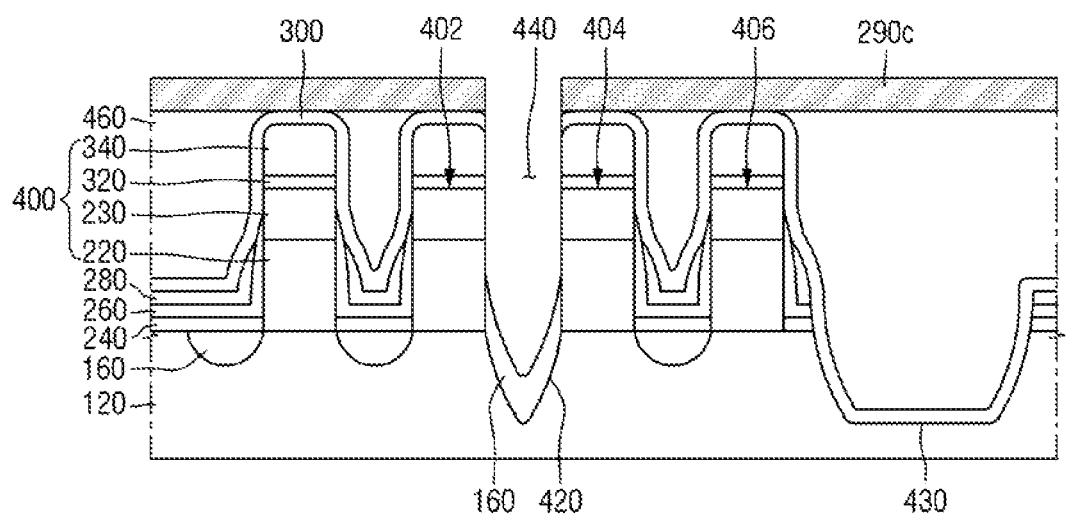
FIG. 20 is a cross-sectional view illustrating re-connecting a bottom source/drain region after the trench is formed during manufacture of a semiconductor device according to an exemplary embodiment of the present inventive concept.

FIG. 20 illustrates a method of re-connecting the bottom source/drain region 160 after the first trench 420 is formed according to an exemplary embodiment of the present inventive concept. In one embodiment, the bottom source/drain region 160 may need to be re-connected between neighboring vertical structures 402, 404 after the first trench 420 is formed. In one embodiment, the bottom source/drain region 160 may be formed by forming the semiconductor material between neighboring vertical structures 402, 404 using a mask by, for example, CVD. For example, Si, Ge, or SiGe may be formed on a surface of the first trench 420. The n-type impurity or the p-type impurity may also be doped to the semiconductor material.

Figure 21:
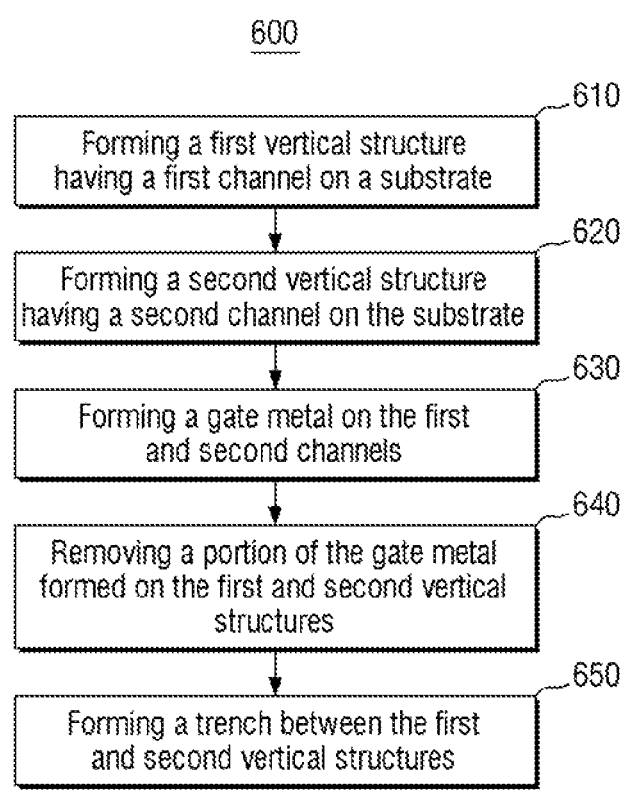
FIG. 21 is a flow chart of a method of fabricating a semiconductor device according to an exemplary embodiment of the present inventive concept.

FIG. 21 is a flow chart 600 of a method of manufacturing the semiconductor device 100 according to an exemplary embodiment of the present inventive concept. It may be noted that the sequence of steps depicted in FIG. 21 is for illustrative purposes only, and is not meant to limit the method in any way as it is understood that the steps may proceed in a different logical order, additional or intervening steps may be included, or described steps may be divided into multiple steps, without detracting from the invention.

At block 610, the first vertical structure 402 having a first vertical channel 220 may be formed on the substrate 120. The gate dielectric layer 260 may be formed on the outer surface of the first vertical channel 220 of the first vertical structure 402. At block 620, a second vertical structure 404 having a second vertical channel 220 may be formed on the substrate 120, and the gate dielectric layer 260 may be formed on the outer surface of the second vertical channel 220. In one example, the second vertical structure 404 may be different from the first vertical structure 402, and the first and second vertical structures 402, 404 may be positioned right next to each other with a predetermined gap between the first and second vertical structures 402, 404.

At block 630, the gate metal 280 may be formed on the first and second vertical channels of the first and second vertical structures 402, 404. In one example, the gate metal 280 may be shared by the first and the second vertical channels 220.

At block 640, a portion of the gate metal 280 may be removed by, for example, dry etching or wet etching. For example, the gate metal 280 formed on the upper portion of the first and second vertical structures 402, 404 may be removed by etching.

At block 650, a portion of the substrate 120 between neighboring vertical structures 400 may be removed to form the first trench 420 on the substrate 120. In one example, the width of the first trench 420 may be substantially equivalent to the gap of the first and second vertical structures 402, 404.

As described above, exemplary embodiments of the present invention provide a method of manufacturing the semiconductor device having one or more trenches for separating a first vertical structure and the second vertical structure. The trench may be formed after the gate metal is formed on the outer surface of the vertical structure.

Although illustrative embodiments of the present invention have been described in detail, it should be understood that the present invention is not intended to be limited to the specific exemplary embodiments disclosed. Based on the foregoing disclosure, those skilled in the art will be able to make various changes, substitutions and alterations without departing from the spirit and scope of the present invention as defined by the following appended claims.

What is claimed is:

1. A method for manufacturing a semiconductor device, the method comprising:
    forming a first vertical structure and a second vertical structure on a substrate, with the second vertical structure positioned right next to the first vertical structure;
    forming a bottom source/drain region between the first and second vertical structures on the substrate;
    forming an insulating layer on the substrate between the first and second vertical structures;

forming a gate metal on the first and second vertical structures;
removing a portion of the gate metal and the insulating layer between the first and second vertical structures;
removing a portion of the substrate between the first and second vertical structures to form a first trench in the substrate, the first trench having a first width;
removing another portion of the substrate spaced apart from the first and second vertical structures to form a second trench in the substrate, the second trench having a second width greater than the first width;
forming a nitride layer that fills the first trench and extends along the second trench; and
forming an oxide layer that fills the second trench on the nitride layer,
wherein the removing the portion of the substrate occurs after the portion of the gate metal and the insulating layer is removed from between the first and second vertical structures.

2. The method of claim 1, wherein the portion of the substrate is removed by dry etching.

3. The method of claim 1, wherein a width of an upper portion of the trench is the same as a gap between the first vertical structure and the second vertical structure.

4. The method of claim 1, wherein the filling the first and second trenches comprises filling the first and second trenches using the oxide layer or the nitride layer until a height of the oxide layer or the nitride layer is above an upper surface of the substrate.

5. The method of claim 1, wherein the forming the gate metal comprises forming the gate metal using at least one of tungsten (W), cobalt (Co), copper (Cu), tantalum (Ta), titanium (Ti), ruthenium (Ru), aluminum (Al), metal carbides, or metal nitrides.

6. The method of claim 1, wherein the insulating layer includes one of a nitride or an oxide.

7. The method of claim 1, further comprising:
removing the oxide layer or the nitride layer between the first and second vertical structures; and
forming the gate metal between the first and second vertical structures, after removing the oxide layer or the nitride layer.

8. The method of claim 7, wherein the oxide layer or the nitride layer above an upper surface of the substrate is removed by a dry etching or a wet etching.

9. The method of claim 1, further comprising;
removing the oxide layer or the nitride layer between the first and second vertical structures; and
forming the bottom source/drain region in the first trench, after removing the oxide layer or the nitride layer.

10. The method of claim 9, wherein the bottom source/drain region includes silicon (Si), germanium (Ge), or silicon-germanium (SiGe).

11. A method of manufacturing a chip, the method comprising:
forming a plurality of bottom source/drain regions on a substrate;
forming first, second, and third vertical structures on the substrate, each of the first, second, and third vertical structures including a vertical channel;
forming bottom spacers on the substrate between the first and second vertical structures, and the second and third vertical structures, respectively;
forming a gate metal on outer surfaces of the first, second and third vertical structures;

removing a portion of the gate metal from the outer surfaces of the first, second, and third vertical structures, respectively; and
forming first and second trenches protruding into the substrate between the first and second vertical structures, and the second and third vertical structures, respectively, wherein a first width of the first trench is smaller than a second width of the second trench, and
wherein the forming the first and second trenches occurs after the portion of the gate metal has been removed from the outer surfaces of the first, second, and third vertical structures.

12. The method of claim 11, wherein the removing the portion of the gate metal comprises etching the portion of the gate metal from upper portions of the first, second, and third vertical structures.

13. The method of claim 11, wherein the forming the first and second trenches comprises etching the substrate to form first and second recesses.

14. The method of claim 11, wherein the forming the first and second trenches comprises, prior to forming the first and second trenches, removing the gate metal and a portion of the substrate in a downward direction between the first and second vertical structures, and the second and third vertical structures, respectively.

15. The method of claim 11, further comprising:
forming a first insulating material in the first trench.

16. The method of claim 15, wherein a height of the first insulating material is greater than a height of an upper surface of the substrate.

17. The method of claim 11, further comprising:
forming first and second insulating materials in the second trench.

18. The method of claim 17, wherein the forming the first and second insulating materials comprises forming the first and second insulating materials in a layered structure in the second trench.

19. The method of claim 17, wherein the first and second insulating materials include an oxide and nitride.

20. A method for fabricating a chip, the method comprising:
forming a plurality of vertical structures on a substrate, each of the vertical structures including a top source/drain region and a channel;
forming a plurality of bottom source/drain regions on the substrate between the plurality of vertical structures;
forming a spacer on the plurality of bottom source/drain regions between the plurality of vertical structures;
forming a gate metal on the spacer and on the plurality of vertical structures;
removing a portion of the gate metal and a portion of the substrate between the plurality of vertical structures to form first and second trenches and corresponding spaces above the first and second trenches, wherein a first width of the first trench is smaller than a second width of the second trench;
forming a first insulating material that fills the first trench and extends along the second trench;
forming a second insulating material different from the first insulating material that fills the second trench on the first insulating material; and
manufacturing a plurality of transistors with the first and second trenches formed between the plurality of transistors.

* * * * *